(12) United States Patent
Okamoto et al.

(10) Patent No.: US 11,309,248 B2
(45) Date of Patent: Apr. 19, 2022

(54) SEMICONDUCTOR INTEGRATED CIRCUIT DEVICE

(71) Applicant: SOCIONEXT INC., Kanagawa (JP)

(72) Inventors: Atsushi Okamoto, Yokohama (JP); Hirotaka Takeno, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 73 days.

(21) Appl. No.: 17/063,452

(22) Filed: Oct. 5, 2020

(65) Prior Publication Data

US 2021/0020571 A1 Jan. 21, 2021

Related U.S. Application Data

(63) Continuation of application No. PCT/JP2019/012472, filed on Mar. 25, 2019.

(30) Foreign Application Priority Data

Apr. 5, 2018 (JP) .............................. JP2018-073285

(51) Int. Cl.
*H01L 23/528* (2006.01)
*H01L 27/092* (2006.01)
*H01L 29/78* (2006.01)
*H03K 17/687* (2006.01)

(52) U.S. Cl.
CPC ...... *H01L 23/5286* (2013.01); *H01L 27/0928* (2013.01); *H01L 29/7827* (2013.01); *H03K 17/6872* (2013.01)

(58) Field of Classification Search
None
See application file for complete search history.

(56) References Cited

U.S. PATENT DOCUMENTS

| | | | |
|---|---|---|---|
| 7,142,019 B2 | 11/2006 | Mair et al. | |
| 2008/0283871 A1 | 11/2008 | Hamada | |
| 2010/0133625 A1 | 6/2010 | Hamada | |
| 2016/0181362 A1 | 6/2016 | Yang et al. | |
| 2016/0308602 A1 | 10/2016 | Yang et al. | |
| 2019/0123741 A1* | 4/2019 | Okamoto | ............ H03K 17/122 |
| 2619/0123741 | 4/2019 | Okamoto et al. | |

FOREIGN PATENT DOCUMENTS

| | | |
|---|---|---|
| JP | 2008-205168 A | 9/2008 |
| JP | 2008-288268 A | 11/2008 |
| WO | 2017/208888 A1 | 12/2017 |

OTHER PUBLICATIONS

International Search Report and Written Opinion issued in corresponding International Patent Application N. PCT/JP2019/012472, dated May 7, 2019, with partial English translation.

* cited by examiner

*Primary Examiner* — Hsien Ming Lee

(74) *Attorney, Agent, or Firm* — McDermott Will & Emery LLP

(57) ABSTRACT

A power switch cell using vertical nanowire (VNW) FETs includes a switch element configured to be capable of switching between electrical connection and disconnection between a global power interconnect and a local power interconnect. The switch element is constituted by at least one VNW FET. The top electrode of the VNW FET constituting the switch element is connected with the global power interconnect.

14 Claims, 15 Drawing Sheets

SEMICONDUCTOR INTEGRATED CIRCUIT DEVICE

CROSS-REFERENCE TO RELATED APPLICATIONS

This is a continuation of International Application No. PCT/JP2019/012472 filed on Mar. 25, 2019, which claims priority to Japanese Patent Application No. 2018-073285 filed on Apr. 5, 2018. The entire disclosures of these applications are incorporated by reference herein.

BACKGROUND

The present disclosure relates to a semiconductor integrated circuit device provided with vertical nanowire (VNW) field effect transistors (FETs), and more particularly to a power switch in a power gating technique.

For transistors as basic constituents of an LSI, improvement in integration degree, reduction in operating voltage, and improvement in operating speed have been achieved thanks to scaling down of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

Also, power gating is one of techniques for reducing the power consumption of a semiconductor integrated circuit device. In the power gating, the inside of a semiconductor integrated circuit device is divided into a plurality of power domains (circuit blocks) and power supply to a non-operating power domain is shut off, thereby reducing a leak current that causes power consumption. In the power gating, power switches are used, which control switching between connection and disconnection between global power interconnects provided for the entire circuit placed in a chip and local power interconnects provided for circuits in power domains.

U.S. Pat. No. 7,142,019 discloses a configuration of a power switch including two switches different in drive capability.

SUMMARY

There is however no prior art document that discloses a layout structure of a power switch cell using VNW FETs.

An objective of the present disclosure is providing a layout structure of a power switch cell using VNW FETs, which is small in area and capable of preventing or reducing a power supply voltage drop.

According to a mode of the present disclosure, a semiconductor integrated circuit device includes: a global power interconnect; and a power domain, wherein the power domain includes a local power interconnect, a plurality of standard cells connected with the local power interconnect, and a power switch cell, the power switch cell includes a switch element configured to be capable of switching between electrical connection and disconnection between the global power interconnect and the local power interconnect, the switch element is constituted by at least one vertical nanowire (VNW) FET, and a top electrode of the VNW FET constituting the switch element is connected with the global power interconnect.

According to the above mode, in the power switch cell, the switch element capable of switching between electrical connection and disconnection between the global power interconnect and the local power interconnect is constituted by at least one VNW FET. The top electrode of the VNW FET constituting the switch element is connected with the global power interconnect. This makes it possible to reduce the resistance value on the supply route of the power supply voltage and thus prevent or reduce a power supply voltage drop.

According to the present disclosure, it is possible to implement a layout structure of a power switch cell using VNW FETs that is small in area and capable of preventing or reducing a power supply voltage drop.

BRIEF DESCRIPTION OF THE DRAWINGS

FIG. 14A is a cross-sectional view and FIG. 14B is a plan view.

DETAILED DESCRIPTION

Embodiments of the present disclosure will be described hereinafter with reference to the accompanying drawings. In the following embodiments, it is assumed that a semiconductor memory device includes power switch cells for implementing the power gating technique and the power switch cells include vertical nanowire FETs (VNW FETs).

Figure 14A:
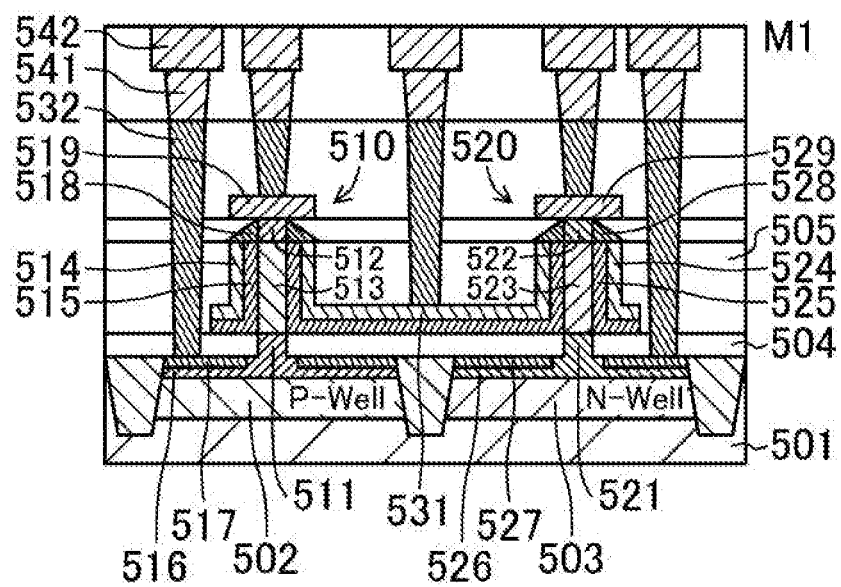
FIGS. 14A and 14B are schematic views showing a basic structure example of vertical nanowire FETs, where
Figure 14B:
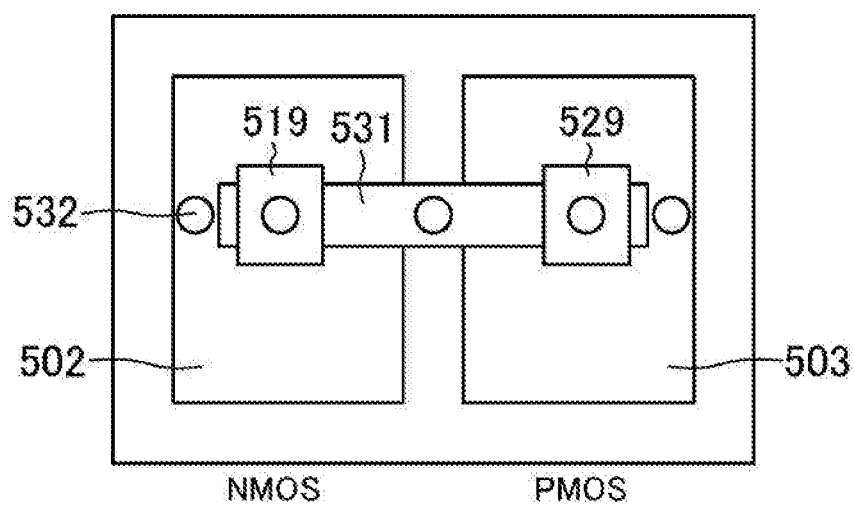

FIGS. 14A and 14B are schematic views showing a basic structure example of VNW FETs, where FIG. 14A is a cross-sectional view and FIG. 14B is a plan view. Note that, in FIG. 14B, illustration of metal interconnects is omitted and, for easy understanding, constituents invisible when actually viewed from top are illustrated.

As shown in FIGS. 14A and 14B, a p-well 502 and an n-well 503 are formed on a semiconductor substrate 501.

Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515. The gate electrode 514 may surround the entire of the nanowire 513, or may surround only part of the nanowire 513. When the gate electrode 514 surrounds only part of the nanowire 513, the gate insulating film 515 may be formed on only the portion of the nanowire 513 surrounded by the gate electrode 514.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 14A and 14B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi.

Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 15A:
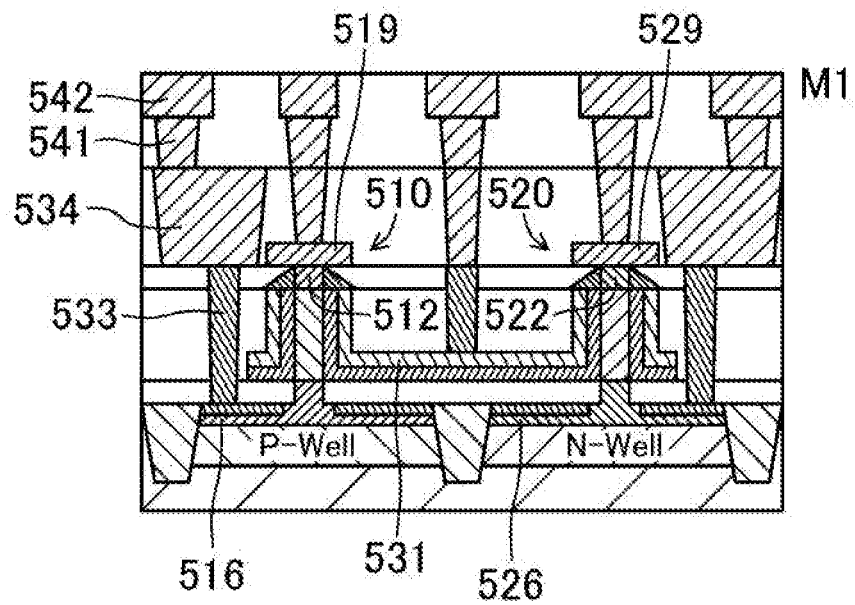
FIGS. 15A and 15B are schematic cross-sectional views showing basic structure examples of vertical nanowire FETs in which local interconnects are used.
Figure 15B:
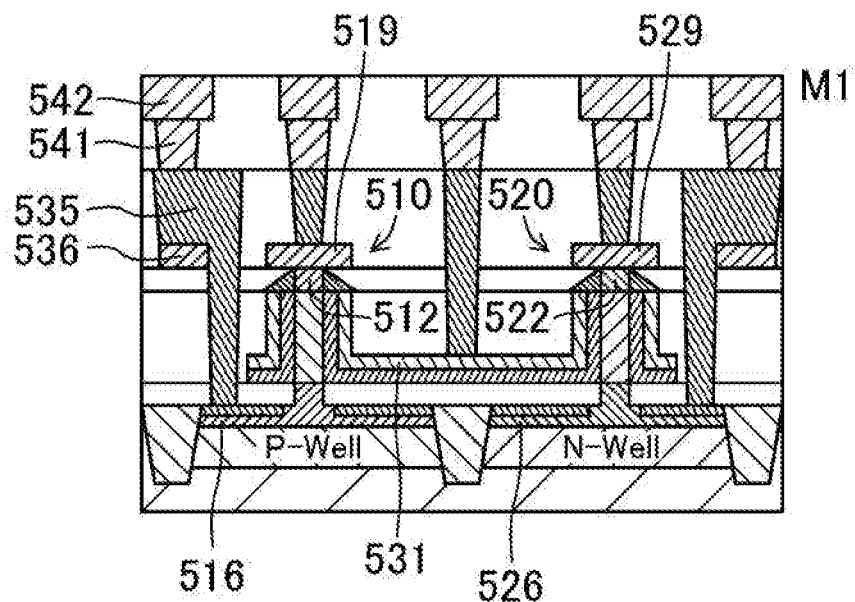

FIGS. 15A and 15B show basic structure examples of VNW FETs in which local interconnects are used. In FIG. 15A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 via the local interconnects 534 and the contacts 541.

In FIG. 15B, local interconnects 535 are formed between the metal interconnect layer M1 and the bottom regions 516 and 526. In other words, the local interconnect 535 corresponds to an integrated form of the contact 533 and the local interconnect 534 in FIG. 15A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, it is assumed that, when one or a plurality of configuration units, each constituted by a vertical nanowire, a top, a bottom, and a gate, constitute one VNW FET, this configuration unit is simply referred to as a "VNW" to distinguish this from the VNW FET. Also, "VDD" refers to a power supply voltage or a high voltage-side power supply line, and "VSS" refers to a power supply voltage or a low voltage-side power supply line.

In the following description, in the plan views such as FIG. 2, the horizontal direction as viewed from the figure is referred to as the X direction (corresponding to the first direction) and the vertical direction as the Y direction (corresponding to the second direction). Also, as used herein, an expression indicating that widths, etc. are the same, like the "same interconnect width" should be understood as including a range of fabrication variations.

First Embodiment

Figure 1:
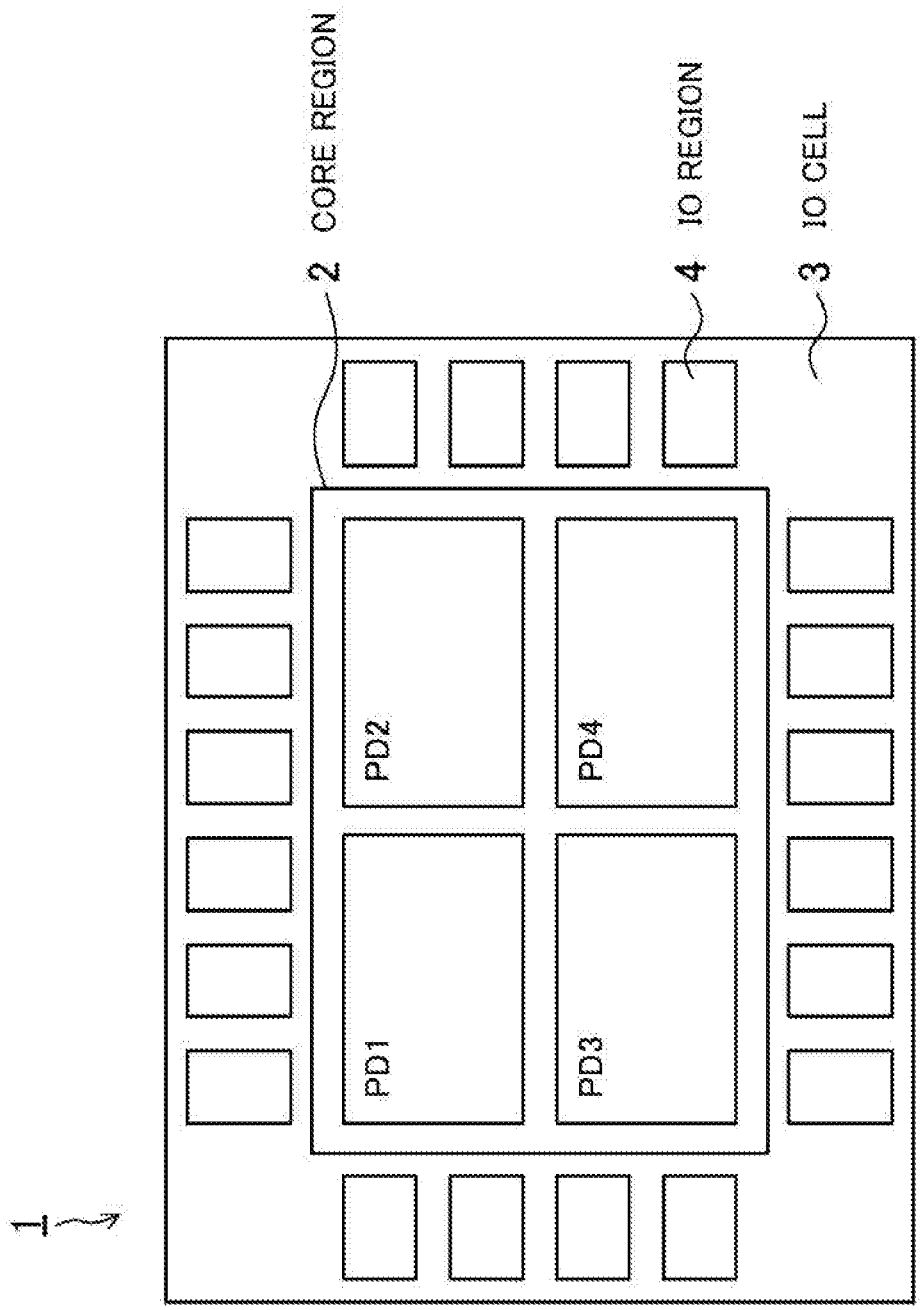
FIG. 1 is a plan view schematically showing the entire configuration of a semiconductor integrated circuit device according to an embodiment.

FIG. 1 is a plan view schematically showing the entire configuration of a semiconductor integrated circuit device according to an embodiment. A semiconductor integrated circuit device 1 shown in FIG. 1 includes a core region 2 in which internal circuits are formed and an IO region 3, surrounding the core region 2, in which interface circuits (IO circuits) are formed. In the core region 2, global power interconnects (not shown) for supply of a power supply potential and a ground potential to the core region 2 are provided throughout the region. The global power interconnects are configured in the shape of a mesh, for example. Although the illustration is simplified in FIG. 1, in the IO region 3, a plurality of IO cells 4 constituting the interface circuits are placed to surround the core region 2.

In FIG. 1, power domains PD1 to PD4 are placed in the core region 2. Local power interconnects (not shown) for supply of a power supply potential and a ground potential are provided in each of the power domains PD1 to PD4. The power domains PD1 to PD4 each include a plurality of power switches configured to be capable of switching between electrical connection and disconnection between the global power interconnects and the local power interconnects in accordance with a control signal. The control signal is sent from a control block that controls power gating, for example. By switching a plurality of power switches in accordance with the control signal, power supply and shutoff can be controlled for each of the power domains PD1 to PD4. In this embodiment, the power switches are provided between the global power interconnects that supply a power supply potential and the local power interconnects that supply a power supply potential. Note that the power switches may be provided between the global power interconnects that supply a ground potential and the local power interconnects that supply a ground potential.

Figure 2:
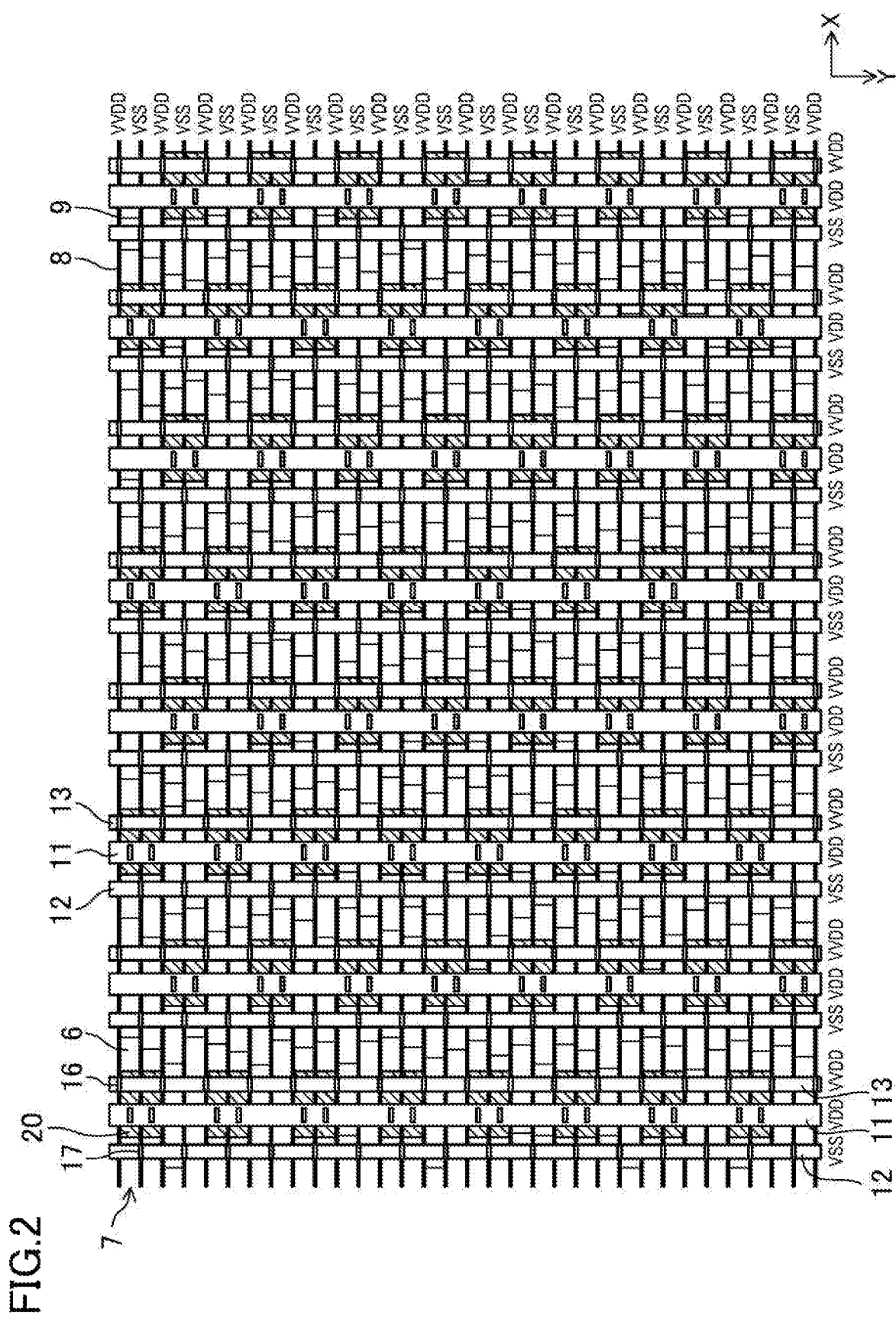
FIG. 2 is a plan view showing a layout configuration of power domains according to the embodiment.

FIG. 2 is an enlarged view of any one of the power domains PD1 to PD4 in the semiconductor integrated circuit device of FIG. 1. FIG. 2 is a simplified illustration of a layout of the power domain. In FIG. 2, a plurality of standard cells 6 are arranged in an X direction (a horizontal direction as viewed from the figure) forming a standard cell row 7, and a plurality of standard cell rows 7 are arranged in a Y direction (a vertical direction as viewed from the figure). The standard cells 6 are basic circuit elements having functions such as an inverter and a logic circuit, for example. By combining and placing the standard cells 6 and routing, a circuit block that implements a predetermined function can be designed and fabricated. Each of the standard cells 6 has an n-type region in which p-type metal oxide semiconductor (PMOS) transistors are formed and a p-type region in which n-type metal oxide semiconductor (NMOS) transistors are formed. In the present disclosure, the n-type region and the p-type region are arranged side by side in the Y direction in the standard cell 6, and the arrangement of the n-type and p-type regions is reversed every standard cell row 7. Illustration of the internal structure of the standard cell 6 is omitted here.

Local power interconnects 8 (denoted as VVDD on the right) that supply a power supply potential to the standard cells 6 and local power interconnects 9 (denoted as VSS on the right) that supply a ground potential to the standard cells 6 are alternately placed to extend in the X direction so that each local power interconnect extends between two adjacent standard cell rows 7. Each of the local power interconnects 8 supplies the power supply potential to the standard cell rows 7 on both sides thereof in the Y direction. Each of the local power interconnects 9 supplies the ground potential to the standard cell rows 7 on both sides thereof in the Y direction.

In a layer above the standard cell rows 7 and the local power interconnects 8 and 9, global power interconnects 11 (denoted as VDD on the bottom) that supply a power supply potential and global power interconnects 12 (denoted as VSS on the bottom) that supply a ground potential are placed to extend in the Y direction. Also, in a layer above the standard cell rows 7 and the local power interconnects 8 and 9, local power interconnects 13 (denoted as VVDD on the bottom) are placed to extend in the Y direction. The local power interconnects 13, provided to enhance the power supply, are connected with the local power interconnects 8 passing below them through via structures 16. Also, the global power interconnects 12 are connected with the local power interconnects 9 passing below them through via structures 17.

Power switch cells 20 (hatched in FIG. 2) are placed for the local power interconnects 8. Each of the power switch cells 20 controls whether or not to shut off the power supply to the corresponding standard cells 6, and has a switch element configured to be capable of switching between electrical connection and disconnection between the local power interconnect 8 and the global power interconnect 11 in accordance with a control signal. In the illustrated example, the power switch cell 20 is a double-height cell. The power switch cell 20 is provided in a region between two adjacent local power interconnects 8 at an intersection of the global power interconnect 11 and the local power interconnect 9 as viewed from top. There are however some intersections of the global power interconnects 11 and the local power interconnects 9 where no power switch cell 20 is placed.

In FIG. 2, the power interconnects from the power supply source to the power switch cells 20, i.e., the global power interconnects 11 are denoted as "VDD" and the power interconnects after passing through the power switch cells 20, i.e., the local power interconnects 8 and 13 are denoted as "VVDD." Note however that VDD and VVDD are the same in power supply potential when the power switch cell 20 is in a conductive state.

Figure 3:
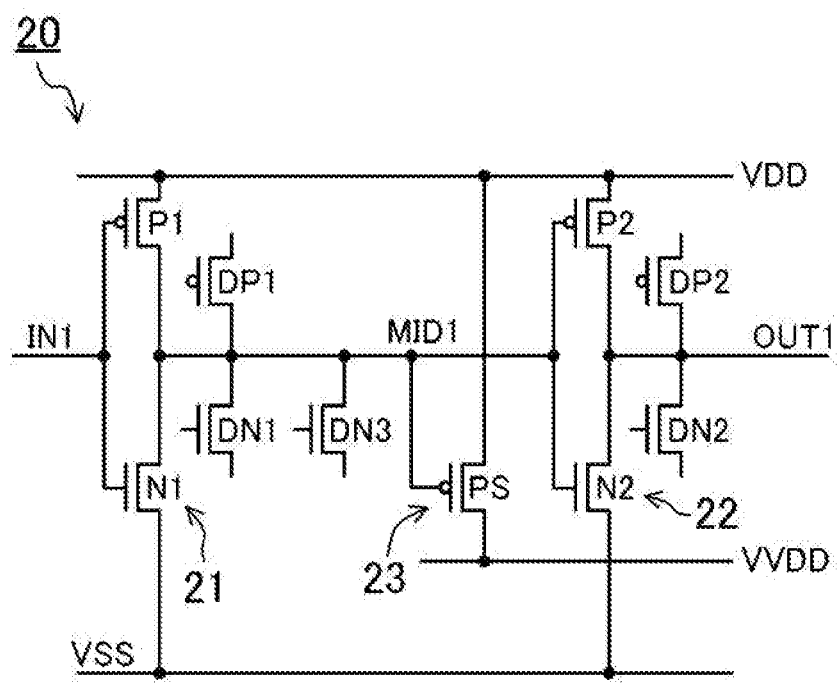
FIG. 3 shows a circuit configuration example of a power switch cell according to the first embodiment.

FIG. 3 is a view showing a circuit configuration of the power switch cell 20 according to this embodiment. As shown in FIG. 3, the power switch cell 20 has serially connected inverters 21 and 22 and a switch element 23. The inverter 21 has a p-type transistor P1 and an n-type transistor N1, and the inverter 22 has a p-type transistor P2 and an n-type transistor N2. The switch element 23 has a p-type transistor PS. A control signal is given to a node IN1 and output from a node OUT1 through the inverters 21 and 22. The p-type transistor PS is connected with a middle node MID1 located between the inverters 21 and 22 at its gate, connected with a node VDD at its source, and connected with a node VVDD at its drain. When the control signal is HIGH, the potential of the middle node MID1 is LOW, whereby the p-type transistor PS becomes an ON (conductive) state. On the other hand, when the control signal is LOW, the potential of the middle node MID1 is HIGH, whereby the p-type transistor PS becomes an OFF (non-conductive) state.

That is, the power switch cell 20 is capable of switching between conduction and shutoff between the node VDD and the node VVDD in accordance with the control signal. In the power switch cell 20, the node VDD is connected with the global power interconnect 11 and the node VVDD is connected with the local power interconnect 8. In the power domain, the power switch cells 20 are connected together in a chain so as to sequentially transmit the control signal.

Also, in the circuit configuration of FIG. 3, a p-type dummy transistor DP1 and n-type dummy transistors DN1 and DN3 are connected to the node MID1, and a p-type dummy transistor DP2 and an n-type dummy transistor DN2 are connected to the node OUT1.

Figure 4:
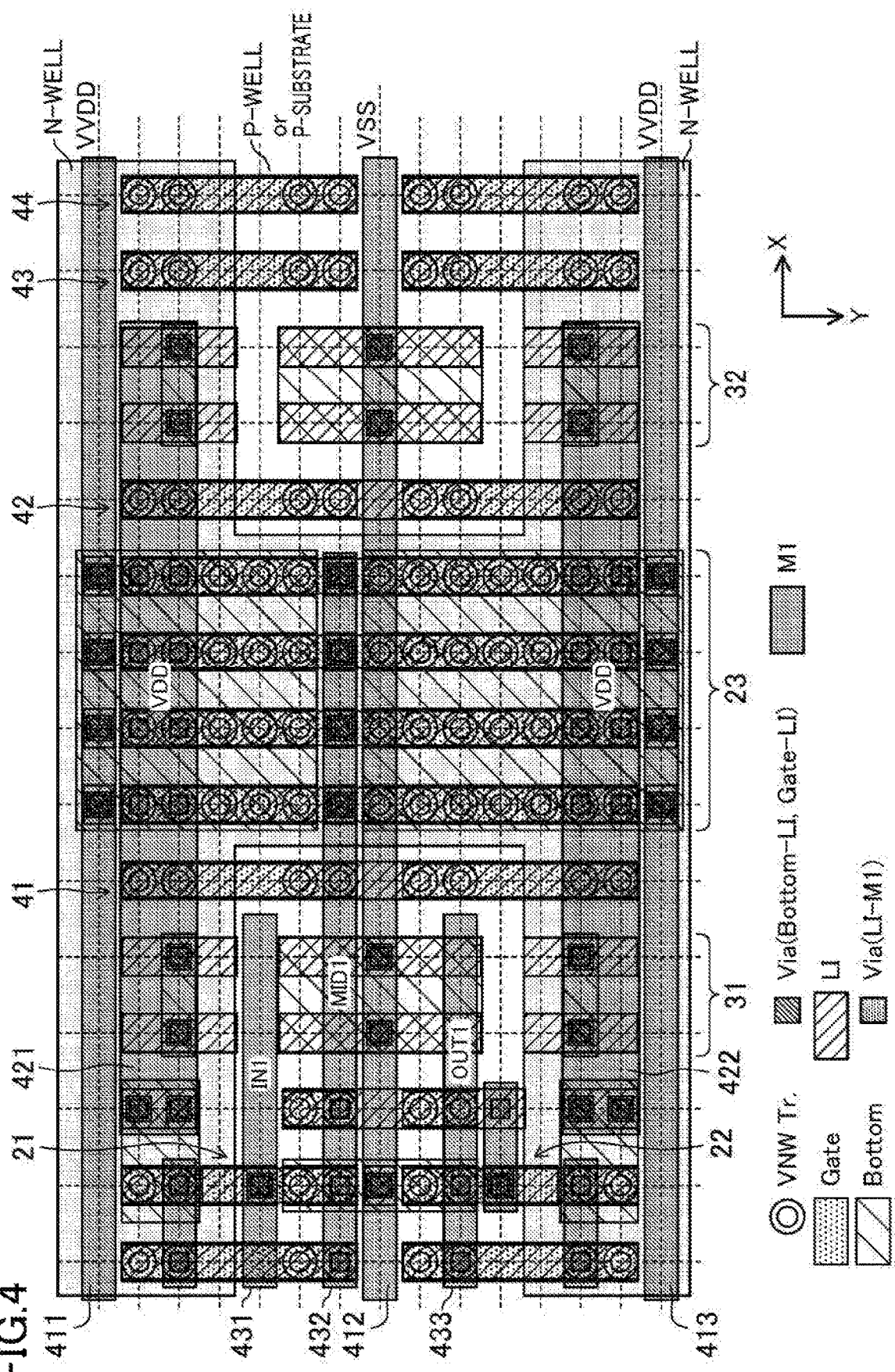
FIG. 4 is a plan view showing a layout structure of the power switch cell according to the first embodiment.
Figure 5:
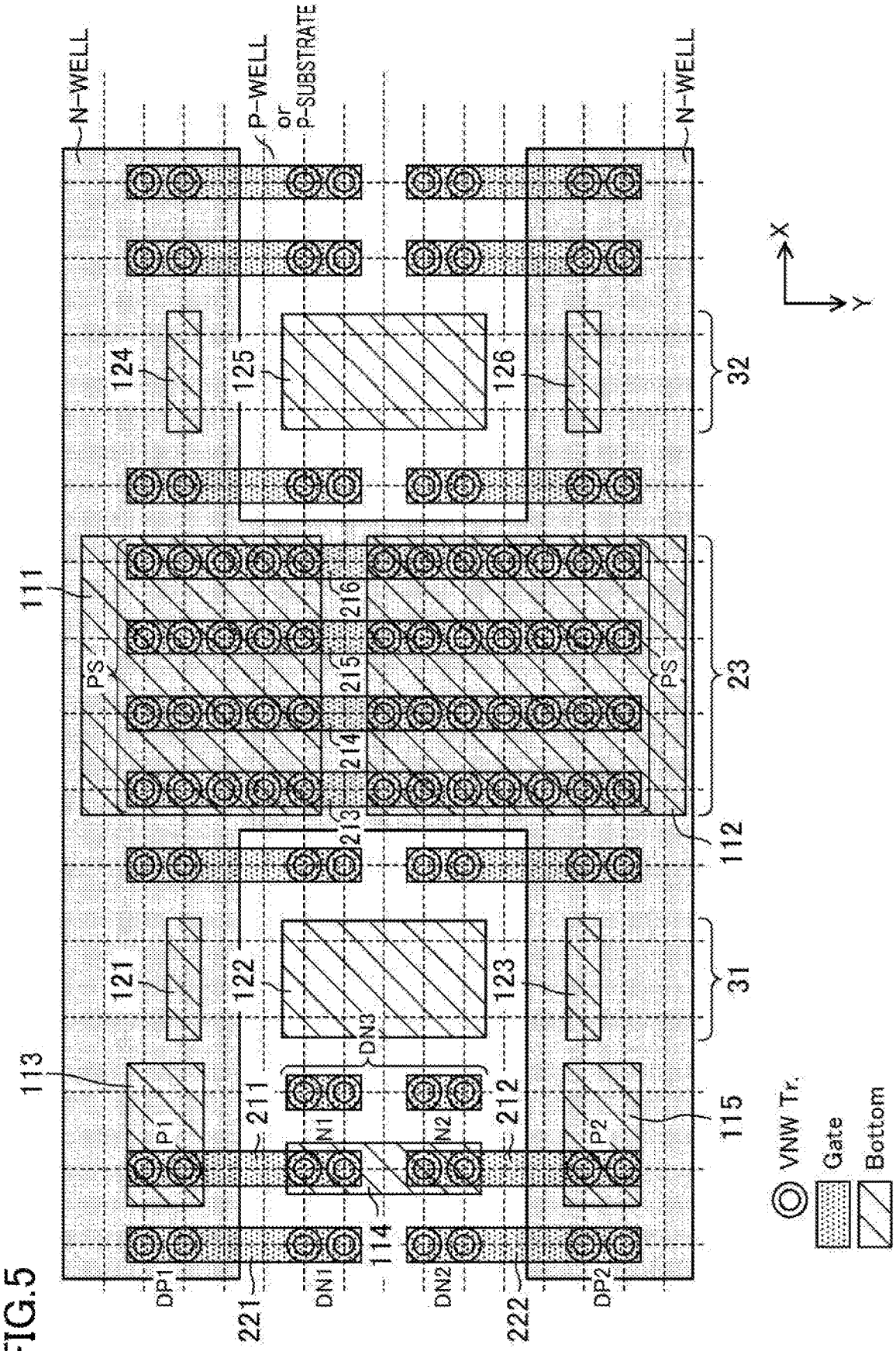
FIG. 5 is a layer-by-layer plan view of the layout structure of FIG. 4.
Figure 6:
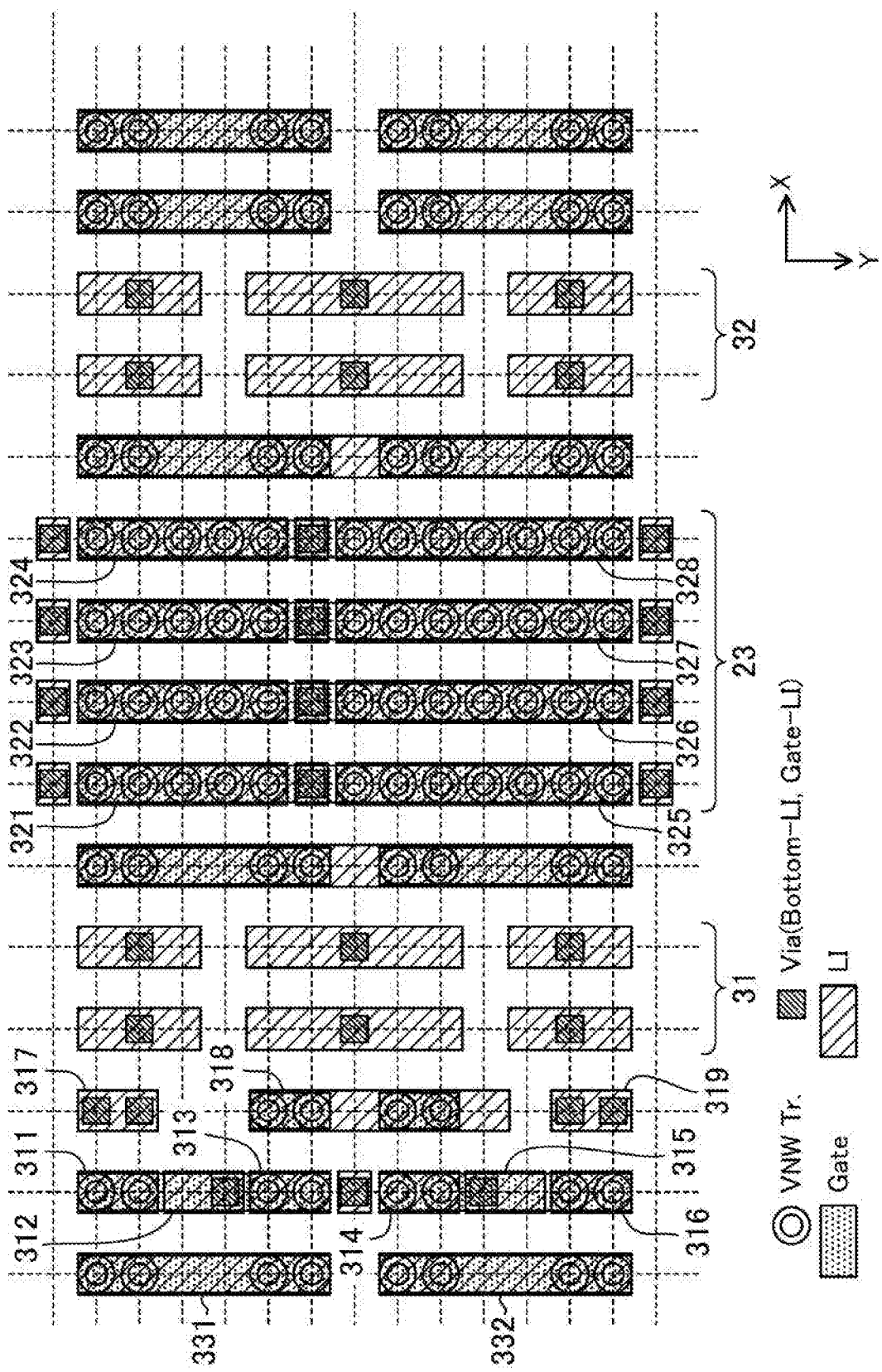
FIG. 6 is a layer-by-layer plan view of the layout structure of FIG. 4.
Figure 7:
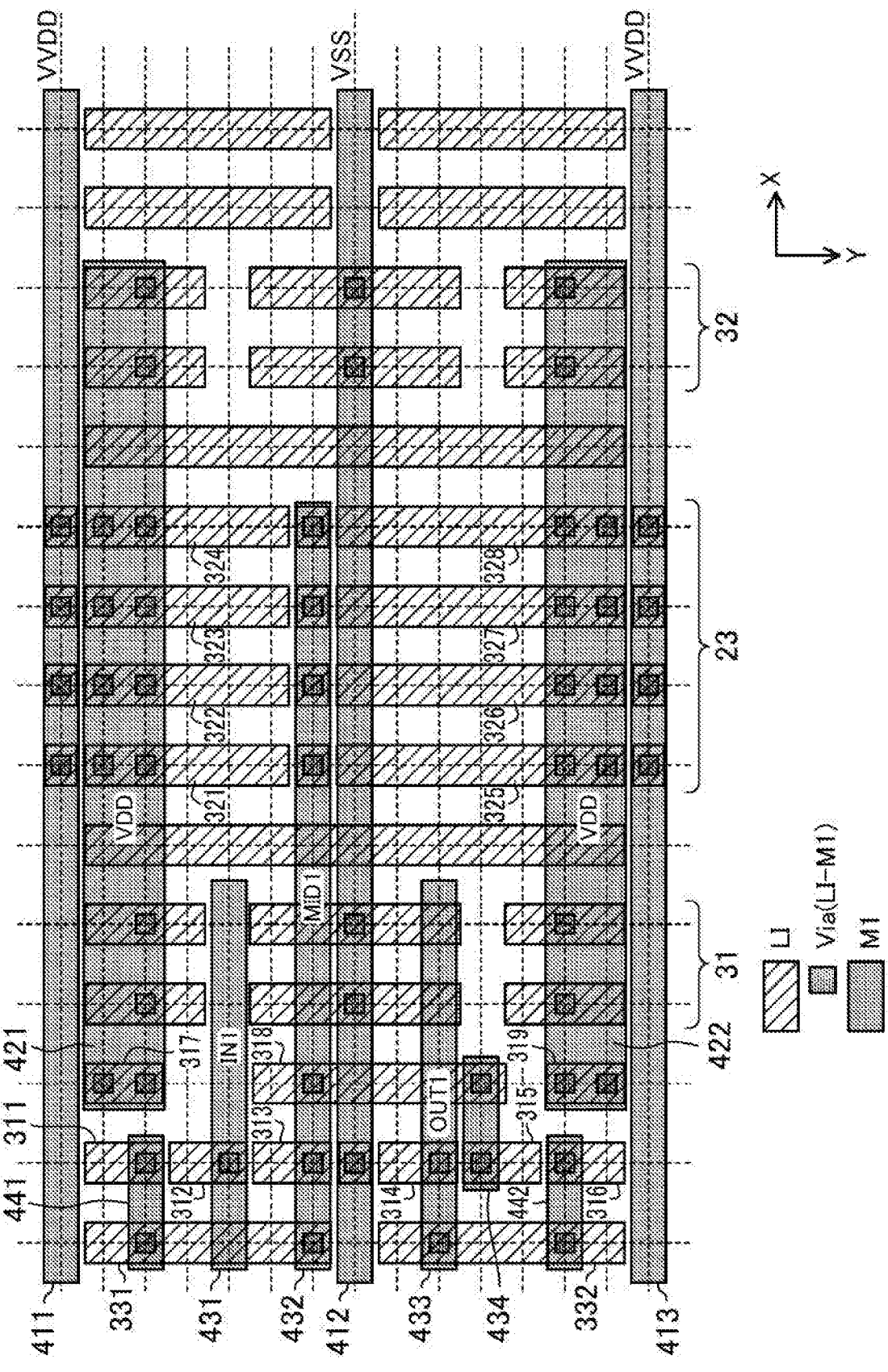
FIG. 7 is a layer-by-layer plan view of the layout structure of FIG. 4.

FIGS. 4 to 7 are views showing a layout structure of the power switch cell according to the first embodiment, where FIG. 4 is an overall plan view and FIGS. 5 to 7 are layer-by-layer plan views. Specifically, FIG. 5 shows VNW FETs and layers below them, FIG. 6 shows VNW FETs and up to local interconnects, and FIG. 7 shows the local interconnects and M1 interconnects.

The dashed lines running vertically and horizontally in the plan views such as FIG. 4 represent grid lines used for placement of components at the time of designing. The grid lines are placed at equal spacing in the X direction and placed at equal spacing in the Y direction. The grid spacing may be the same, or different from each other, in the X and Y directions. Also, the grid spacing may be different between layers. For example, grid lines for VNW FETs and grid lines for M1 interconnects may be placed at different spacing. Further, the components are not necessarily required to lie on grid lines. It is however preferable to place the components on grid lines from the standpoint of preventing or reducing fabrication variations.

The device structure according to this embodiment is based on the structure of FIG. 15A, although it can be a structure based on the structure of FIG. 14 or FIG. 15B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

The power switch cell shown in FIGS. 4 to 7 is placed between local power interconnects (VVDD) 411 and 413 extending in the X direction, and a local power interconnect (VSS) 412 passes above the power switch cell. The local power interconnects 411 and 413 are part of the local power interconnects 8 shown in FIG. 2, and the local power interconnect 412 is part of the local power interconnect 9 shown in FIG. 2. M1 interconnects 421 and 422, which correspond to the node VDD, are connected with the global power interconnect 11 passing above them in the Y direction. An M1 interconnect 431 corresponds to the node IN1, an M1 interconnect 432 corresponds to the node MID1, and an M1 interconnect 433 corresponds to the node OUT1.

An n-well is formed from under the local power interconnect 411 over to nearly the center between the local power interconnect 411 and the local power interconnect 412. The n-well is also formed from under the local power interconnect 413 over to nearly the center between the local power interconnect 413 and the local power interconnect 412.

In a region for formation of the switch element 23 located in nearly the center in the X direction, the n-well is formed continuously from under the local power interconnect 411 to under the local power interconnect 413. P-type doped bottom regions 111 and 112 are formed on this continuous part of the n-well. The bottom region 111 is connected with the local power interconnect 411 through vias and local interconnects. The bottom region 112 is connected with the local power interconnect 413 through vias and local interconnects.

A total of 20 (4 in the X direction×5 in the Y direction) VNWs are formed on the bottom region 111, and the bottoms of the VNWs are connected with the bottom region 111. A total of 28 (4 in the X direction×7 in the Y direction) VNWs are formed on the bottom region 112, and the bottoms of the VNWs are connected with the bottom region 112. The p-type transistor PS constituting the switch element 23 is formed of these 48 VNWs formed on the bottom regions 111 and 112.

The gates of the 48 VNWs constituting the p-type transistor PS, arranged in four columns in the Y direction, are mutually connected column by column through gate interconnects 213, 214, 215, and 216. The gate interconnects 213, 214, 215, and 216 are connected with the M1 interconnect 432 extending in the X direction, which is to be the middle node MID1, through vias and local interconnects.

The tops of the VNWs formed in four columns on the bottom region 111, out of the VNWs constituting the p-type transistor PS, are mutually connected column by column through local interconnects 321, 322, 323, and 324. The local interconnects 321, 322, 323, and 324 are connected with the M1 interconnect 421 extending in the X direction, which is connected with the global power interconnect 11, through vias.

The tops of the VNWs formed in four columns on the bottom region 112, out of the VNWs constituting the p-type transistor PS, are mutually connected column by column through local interconnects 325, 326, 327, and 328. The local interconnects 325, 326, 327, and 328 are connected with the M1 interconnect 422 extending in the X direction, which is connected with the global power interconnect 11, through vias.

In a region on the left side of the switch element 23 as viewed from the figure, a bottom region 113 is formed near the local power interconnect 411. A bottom region 114 is formed under the local power interconnect 412 to extend in the Y direction. A bottom region 115 is formed near the local power interconnect 413. The bottom region 113 is connected with the M1 interconnect 421 through vias and a local interconnect 317, to receive the power supply voltage VDD from the M1 interconnect 421. The bottom region 114 is connected with the M1 interconnect 412 through vias and a local interconnect, to receive the power supply voltage VSS from the M1 interconnect 412. The bottom region 115 is connected with the M1 interconnect 422 through vias and a local interconnect 319, to receive the power supply voltage VDD from the M1 interconnect 422.

The p-type transistor P1 and the n-type transistor N1 constituting the inverter 21 and the p-type transistor P2 and the n-type transistor N2 constituting the inverter 22 are each constituted by two VNWs.

The transistor P1 is formed on the bottom region 113, and the bottom thereof is connected with the bottom region 113. The transistor N1 is formed on the bottom region 114, and the bottom thereof is connected with the bottom region 114. The gates of the transistors P1 and N1 are mutually connected through a gate interconnect 211 extending in the Y direction. The gate interconnect 211 is connected with the M1 interconnect 431 that is to be the node IN1 through vias and a local interconnect 312. The top of the transistor P1 is connected to a local interconnect 311. The local interconnect 311 is connected with the M1 interconnect 432 that is to be the middle node MID1 through a via, an M1 interconnect 441, a local interconnect 331, and a via. The top of the transistor N1 is connected to a local interconnect 313. The local interconnect 313 is connected with the M1 interconnect 432 that is to be the middle node MID1 through a via.

The transistor P2 is formed on the bottom region 115, and the bottom thereof is connected with the bottom region 115. The transistor N2 is formed on the bottom region 114, and the bottom thereof is connected with the bottom region 114. The gates of the transistors P2 and N2 are mutually connected through a gate interconnect 212 extending in the Y direction. The gate interconnect 212 is connected with an M1 interconnect 434 through vias and a local interconnect 315. The M1 interconnect 434 is connected with the M1 interconnect 432 that is to be the middle node MID1 through a via, a local interconnect 318, and a via. The top of the transistor P2 is connected to a local interconnect 316. The local interconnect 316 is connected with the M1 interconnect 433 that is to be the node OUT1 through a via, an M1 interconnect 442, a local interconnect 332, and a via. The top of the transistor N2 is connected to a local interconnect 314. The local interconnect 314 is connected with the M1 interconnect 433 that is to be the node OUT1 through a via.

The p-type dummy transistors DP1 and DP2 and the n-type dummy transistors DN1 and DN2 are placed on the left side of the transistors P1, N1, N2, and P2 constituting the inverters 21 and 22 as viewed from the figure. The transistors DP1, DN1, DN2, and DP2 are each constituted by two VNWs and arranged in this order in the Y direction.

The gates of the transistors DP1 and DN1 are mutually connected through a gate interconnect 221, and the tops thereof are connected with the local interconnect 331. The local interconnect 331 is connected with the M1 interconnect 432 that is to be the middle node MID1 through a via. The gates of the transistors DP2 and DN2 are mutually connected through a gate interconnect 222, and the tops thereof are connected with the local interconnect 332. The local interconnect 332 is connected with the M1 interconnect 433 that is to be the node OUT1 through a via.

The n-type dummy transistor DN3 is placed on the right side of the transistors P1, N1, N2, and P2 constituting the inverters 21 and 22 as viewed from the figure. The transistor DN3 is constituted by four VNWs arranged in the Y direction. The top of the transistor DN3 is connected with the local interconnect 318. The local interconnect 318 is connected with the M1 interconnect 432 that is to be the middle node MID1 through a via.

Tap regions 31 and 32 are formed on both sides of the switch element 23 in the X direction. The tap regions 31 and 32 supply the power supply voltage VDD to the n-well, and supply the power supply voltage VSS to a p-well or a p-substrate.

In the tap regions 31 and 32, n-type doped bottom regions 121, 123, 124, and 126 are formed on the n-well. The bottom regions 121 and 124 are connected with the M1 interconnect 421 through vias and local interconnects, to receive the power supply voltage VDD from the M1 interconnect 421. The bottom regions 123 and 126 are connected with the M1 interconnect 422 through vias and local interconnects, to receive the power supply voltage VDD from the M1 interconnect 422.

In the tap regions 31 and 32, p-type doped bottom regions 122 and 125 are formed on the p-substrate or the p-well. The bottom regions 122 and 125 are connected with the M1 interconnect 412 through vias and local interconnects, to receive the power supply voltage VSS from the M1 interconnect 412.

Dummy transistors 41 and 42 are respectively formed between the tap region 31 and the region of the switch element 23 and between the tap region 32 and the region of the switch element 23. With this, spacing between the region of the switch element 23 and the tap regions 31 and 32 is secured. Also, dummy transistors 43 and 44 are placed between the tap region 32 and the right end of the power switch cell as viewed from the figure, to secure spacing between the tap region 32 and a cell adjoining the power switch on the right.

The layout structure of the power switch cell according to this embodiment has features as follows, for example.

The p-type transistor PS constituting the switch element 23 is constituted by 48 VNWs, and the tops of the 48 VNWs are connected to the M1 interconnects 421 and 422 that are connected to the global power interconnect 11. This makes it possible to reduce the resistance value on the supply route of the power supply voltage VDD and thus prevent or reduce a power supply voltage drop. Also, the bottom regions 111 and 112 to which the bottoms of the 48 VNWs are connected extend up to portions under the local power interconnects 411 and 413, respectively, and are connected with the local power interconnects 411 and 413 in the overlap portions as viewed from top. This makes it possible to reduce the resistance value on the supply route of the power supply voltage VDD.

The dummy transistors DP1, DN1, DP2, and DN2 are placed near the left end of the cell as viewed from the figure. Also, the dummy transistors 43 and 44 are placed near the right end of the cell as viewed from the figure. With this placement, the transistor performance predictability can be secured for standard cells placed on both sides of the power switch cell in the X direction. The placement of the dummy transistors is not necessarily required. However, by placing dummy transistors, the transistor pattern uniformity improves.

While the bottom region 111 has a rectangular shape to which 20 VNWs are connected in common and the bottom region 112 has a rectangular shape to which 28 VNWs are connected in common, the shape of the bottom regions to which the bottoms of VNWs are connected is not limited to this. For example, the bottom region 111 may be divided into four strips, and each column of five VNWs arranged in the Y direction may be connected to one of the four strips.

Second Embodiment

In the first embodiment, the power switch cell 20 includes one switch element 23. In this embodiment, the power switch cell 20 is configured to include two switch elements different in drive performance.

Figure 8:
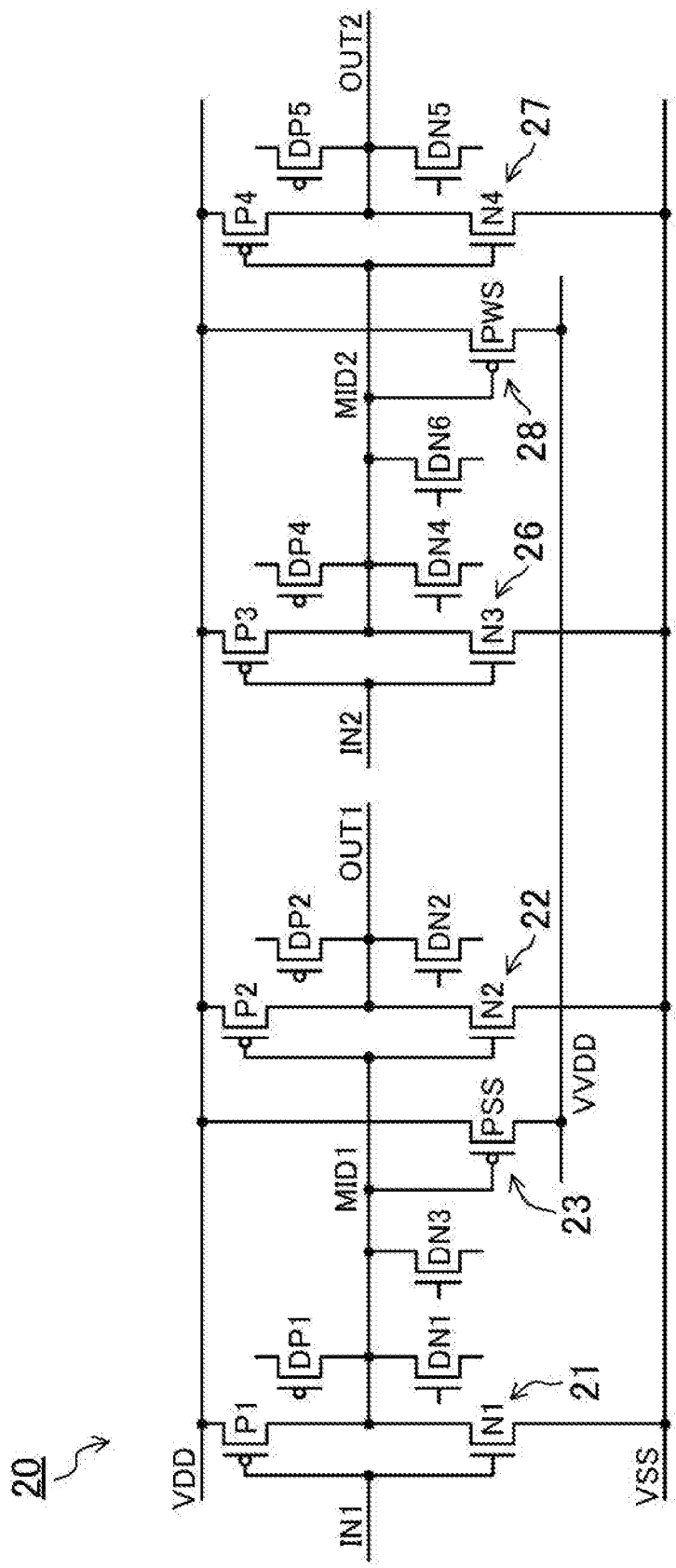
FIG. 8 shows a circuit configuration example of a power switch cell according to the second embodiment.

FIG. 8 shows a circuit configuration example of the power switch cell 20 according to this embodiment. As shown in FIG. 8, the power switch cell 20 includes switch elements 23 and 28. The switch element 23 is constituted by a p-type transistor PSS, and the switch element 28 is constituted by a p-type transistor PWS. It is herein assumed that the p-type transistor PWS constituting the switch element 28 is lower in drive performance than the p-type transistor PSS constituting the switch element 23.

Specifically, the power switch cell 20 has serially connected inverters 21 and 22 and the switch element 23. The inverter 21 has a p-type transistor P1 and an n-type transistor N1, and the inverter 22 has a p-type transistor P2 and an n-type transistor N2. The switch element 23 has the p-type transistor PSS. A control signal is fed to a node IN1 and output from a node OUT1 by way of the inverters 21 and 22. The p-type transistor PSS is connected with a middle node MID located between the inverters 21 and 22 at its gate, connected with a node VDD at its source, and connected with a node VVDD at its drain. When the control signal is HIGH, the potential of the middle node MID1 is LOW, whereby the p-type transistor PSS becomes an ON (conductive) state. On the other hand, when the control signal is LOW, the potential of the middle node MID1 is HIGH, whereby the p-type transistor PSS becomes an OFF (non-conductive) state.

The power switch cell 20 also has serially connected inverters 26 and 27 and the switch element 28. The inverter 26 has a p-type transistor P3 and an n-type transistor N3, and the inverter 27 has a p-type transistor P4 and an n-type transistor N4. The switch element 28 has the p-type transistor PWS. A control signal is fed to a node IN2 and output from a node OUT2 by way of the inverters 26 and 27. The p-type transistor PWS is connected with a middle node MID2 located between the inverters 26 and 27 at its gate, connected with a node VDD at its source, and connected with a node VVDD at its drain. When the control signal is HIGH, the potential of the middle node MID2 is LOW, whereby the p-type transistor PWS becomes an ON (conductive) state. On the other hand, when the control signal is LOW, the potential of the middle node MID2 is HIGH, whereby the p-type transistor PWS becomes an OFF (non-conductive) state.

That is, the power switch cell 20 is capable of switching between conduction and shutoff between the node VDD and the node VVDD in accordance with the two control signals. In the power switch cell 20, the node VDD is connected with the global power interconnect 11 and the node VVDD is connected with the local power interconnect 8. In the power domain, the power switch cells 20 are connected together in a chain so as to sequentially transmit the control signal.

A p-type dummy transistor DP1 and n-type dummy transistors DN1 and DN3 are connected to the node MID1, and a p-type dummy transistor DP2 and an n-type dummy transistor DN2 are connected to the node OUT1. Also, a p-type dummy transistor DP4 and n-type dummy transistors DN4 and DN6 are connected to the node MID2, and a p-type dummy transistor DP5 and an n-type dummy transistor DN5 are connected to the node OUT2.

Figure 9:
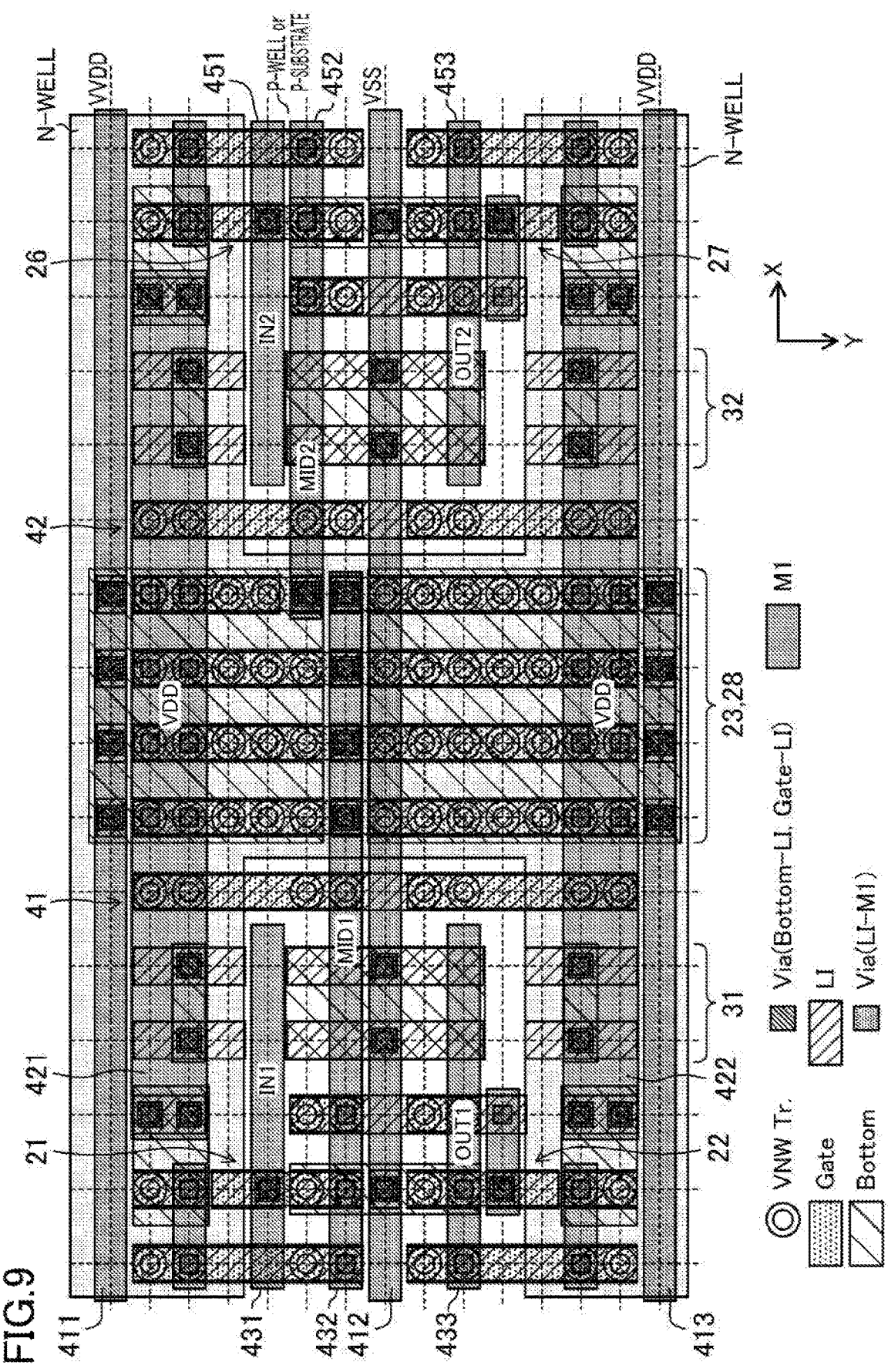
FIG. 9 is a plan view showing a layout structure of the power switch cell according to the second embodiment.
Figure 10:
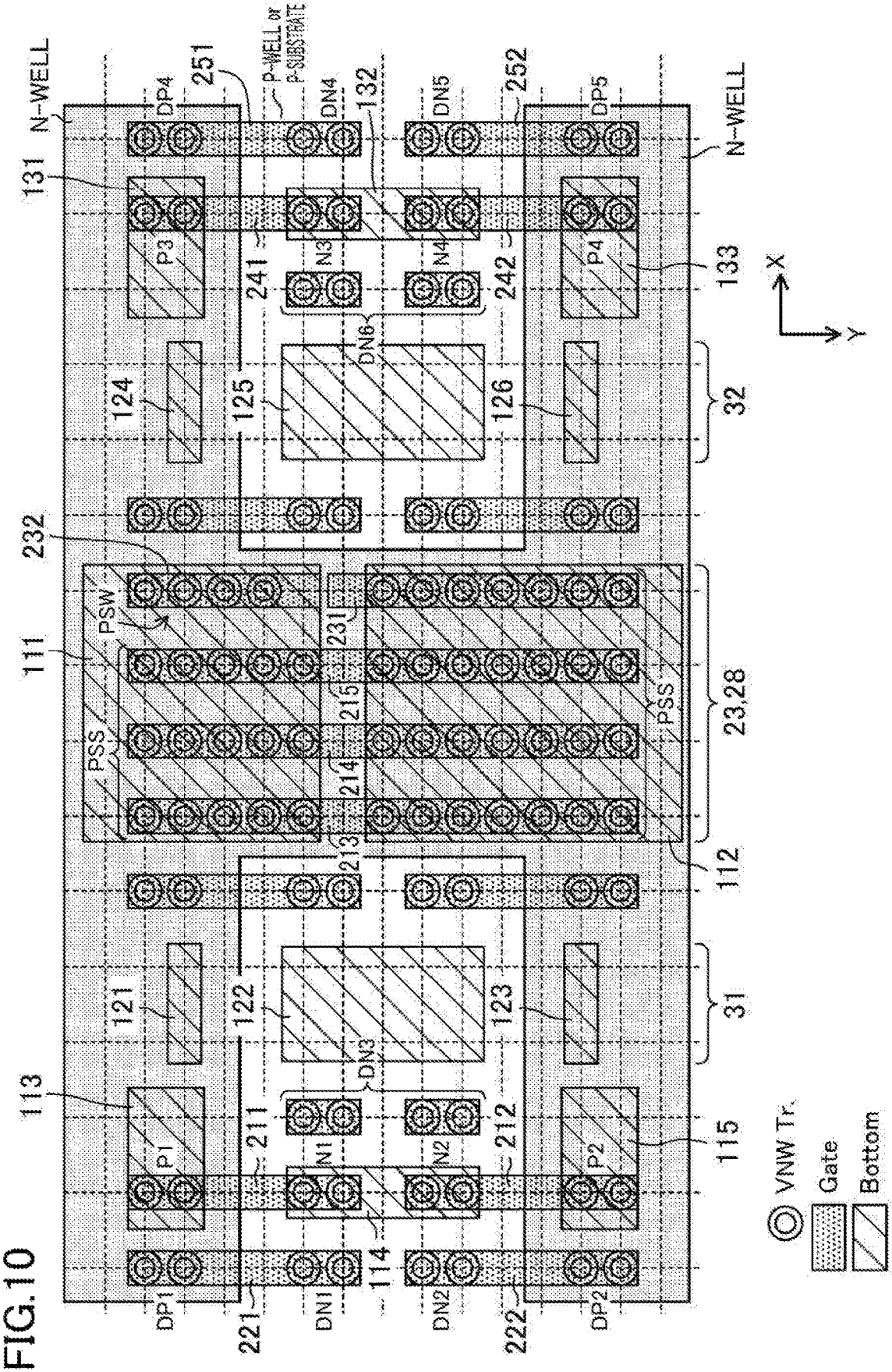
FIG. 10 is a layer-by-layer plan view of the layout structure of FIG. 9.
Figure 11:
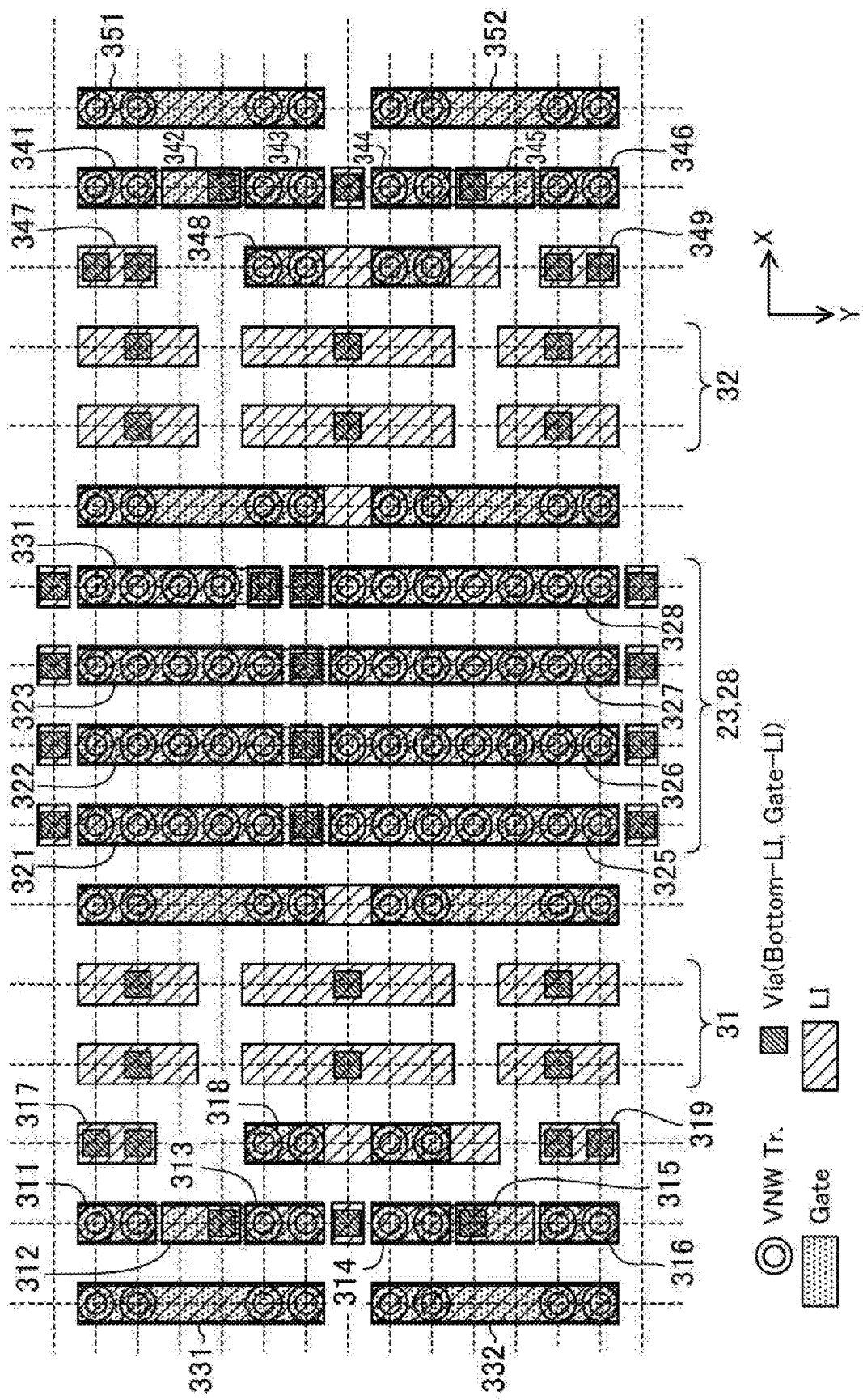
FIG. 11 is a layer-by-layer plan view of the layout structure of FIG. 9.
Figure 12:
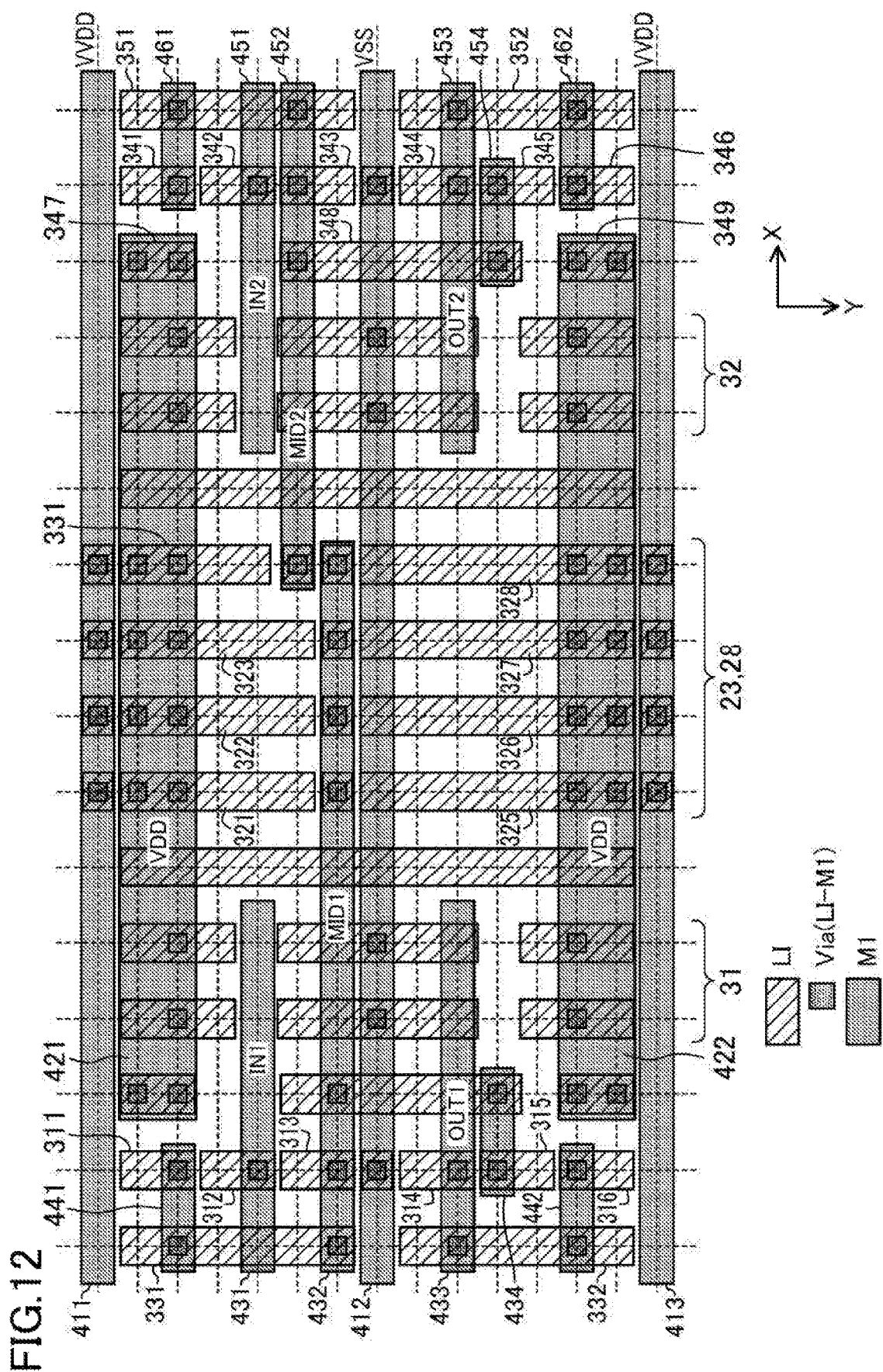
FIG. 12 is a layer-by-layer plan view of the layout structure of FIG. 9.

FIGS. 9 to 12 are views showing a layout structure of the power switch cell according to the second embodiment, where FIG. 9 is an overall plan view and FIGS. 10 to 12 are layer-by-layer plan views. Specifically, FIG. 10 shows VNW FETs and layers below them, FIG. 11 shows VNW FETs and up to local interconnects, and FIG. 12 shows the local interconnects and M1 interconnects. Note that description of components used in common with the first embodiment may be omitted in some cases.

The power switch cell shown in FIGS. 9 to 12 is placed between local power interconnects (VVDD) 411 and 413 extending in the X direction, and a local power interconnect (VSS) 412 passes above the power switch cell. The local power interconnects 411 and 413 are part of the local power interconnects 8 shown in FIG. 2, and the local power interconnect 412 is part of the local power interconnect 9 shown in FIG. 2. M1 interconnects 421 and 422, which correspond to the node VDD, are connected with the global power interconnect 11 passing above them in the Y direction. An M1 interconnect 431 corresponds to the node IN1, an M1 interconnect 432 corresponds to the node MID1, and an M1 interconnect 433 corresponds to the node OUT1. An M1 interconnect 451 corresponds to the node IN2, an M1 interconnect 452 corresponds to the node MID2, and an M1 interconnect 453 corresponds to the node OUT2.

An n-well is formed from under the local power interconnect 411 over to nearly the center between the local power interconnect 411 and the local power interconnect 412. The n-well is also formed from under the local power interconnect 413 over to nearly the center between the local power interconnect 413 and the local power interconnect 412.

In a region for formation of the switch elements 23 and 28 located in nearly the center in the X direction, the n-well is formed continuously from under the local power interconnect 411 to under the local power interconnect 413. P-type doped bottom regions 111 and 112 are formed on this continuous part of the n-well. The bottom region 111 is connected with the local power interconnect 411 through vias and local interconnects. The bottom region 112 is connected with the local power interconnect 413 through vias and local interconnects.

Four columns of VNWs are arranged in the X direction on the bottom region 111, and the bottoms of the VNWs are connected with the bottom region 111. Three columns on the left as viewed from the figure each include five VNWs, and the rightmost column includes four VNWs. A total of 28 (4 in the X direction×7 in the Y direction) VNWs are formed on the bottom region 112, and the bottoms of the VNWs are connected with the bottom region 112. The p-type transistor PSS constituting the switch element 23 is formed of 15 VNWs of the three columns on the left, out of the VNWs formed on the bottom region 111, and 28 VNWs formed on the bottom region 112, totally 43 VNWs. The p-type transistor PWS constituting the switch element 28 is formed of four VNWs of the rightmost column out of the VNWs formed on the bottom region 111.

The gates of the 43 VNWs constituting the p-type transistor PSS, arranged in four columns in the Y direction, are mutually connected column by column through gate interconnects 213, 214, 215, and 231. The gate interconnects 213, 214, 215, and 231 are connected with the M1 interconnect 432 extending in the X direction, which is to be the middle node MID1, through vias and local interconnects.

The gates of the four VNWs constituting the p-type transistor PWS are mutually connected through a gate interconnect 232. The gate interconnect 232 is connected with the M1 interconnect 452 extending in the X direction, which is to be the middle node MID2, through vias and a local interconnect.

The tops of the VNWs formed in three columns on the bottom region 111, out of the VNWs constituting the p-type transistor PSS, are mutually connected column by column through local interconnects 321, 322, and 323. The local interconnects 321, 322, and 323 are connected with the M1 interconnect 421 extending in the X direction, which is connected with the global power interconnect 11, through vias. The tops of the VNWs constituting the p-type transistor PWS formed on the bottom region 111 are mutually connected through a local interconnect 331. The local interconnect 331 is connected with the M1 interconnect 421 extending in the X direction, which is connected with the global power interconnect 11, through a via.

The tops of the VNWs formed in four columns on the bottom region 112, out of the VNWs constituting the p-type transistor PSS, are mutually connected column by column through local interconnects 325, 326, 327, and 328. The local interconnects 325, 326, 327, and 328 are connected with the M1 interconnect 422 extending in the X direction, which is connected with the global power interconnect 11, through vias.

The layout structure of the region on the left side of the switch elements 23 and 28 as viewed from the figure are similar to that of the region on the left side of the switch 23 described in the first embodiment.

In the region on the right side of the switch elements 23 and 28, a bottom region 131 is formed near the local power interconnect 411. A bottom region 132 is formed under the local power interconnect 412 to extend in the Y direction. A bottom region 133 is formed near the local power interconnect 413. The bottom region 131 is connected with the M1 interconnect 421 through vias and a local interconnect 347, to receive the power supply voltage VDD from the M1 interconnect 421. The bottom region 132 is connected with the M1 interconnect 412 through vias and a local interconnect, to receive the power supply voltage VSS from the M1 interconnect 412. The bottom region 133 is connected with the M1 interconnect 422 through vias and a local interconnect 349, to receive the power supply voltage VDD from the M1 interconnect 422.

The p-type transistor P3 and the n-type transistor N3 constituting the inverter 26 and the p-type transistor P4 and the n-type transistor N4 constituting the inverter 27 are each constituted by two VNWs.

The transistor P3 is formed on the bottom region 131, and the bottom thereof is connected with the bottom region 131. The transistor N3 is formed on the bottom region 132, and the bottom thereof is connected with the bottom region 132. The gates of the transistors P3 and N3 are mutually connected through a gate interconnect 241 extending in the Y direction. The gate interconnect 241 is connected with the M1 interconnect 451 that is to be the node IN2 through vias and a local interconnect 342. The top of the transistor P3 is connected to a local interconnect 341. The local interconnect 341 is connected with the M1 interconnect 452 that is to be the middle node MID2 through a via, an M1 interconnect 461, a local interconnect 351, and a via. The top of the transistor N3 is connected to a local interconnect 343. The local interconnect 343 is connected with the M1 interconnect 452 that is to be the middle node MID2 through a via.

The transistor P4 is formed on the bottom region 133, and the bottom thereof is connected with the bottom region 133. The transistor N4 is formed on the bottom region 132, and the bottom thereof is connected with the bottom region 132. The gates of the transistors P4 and N4 are mutually connected through a gate interconnect 242 extending in the Y direction. The gate interconnect 242 is connected with an M1 interconnect 454 through vias and a local interconnect 345. The M1 interconnect 454 is connected with the M1 interconnect 452 that is to be the middle node MID2 through a via, a local interconnect 348, and a via. The top of the transistor P4 is connected to a local interconnect 346. The local interconnect 346 is connected with the M1 interconnect 453 that is to be the node OUT2 through a via, an M1 interconnect 462, a local interconnect 352, and a via. The top of the transistor N4 is connected to a local interconnect 344. The local interconnect 344 is connected with the M1 interconnect 453 that is to be the node OUT2 through a via.

The p-type dummy transistors DP4 and DP5 and the n-type dummy transistors DN4 and DN5 are placed on the right side of the transistors P3, N3, N4, and P4 constituting the inverters 26 and 27 as viewed from the figure. The transistors DP4, DN4, DN5, and DP5 are each constituted by two VNWs and arranged in this order in the Y direction.

The gates of the transistors DP4 and DN4 are mutually connected through a gate interconnect 251, and the tops thereof are connected with the local interconnect 351. The local interconnect 351 is connected with the M1 interconnect 452 that is to be the middle node MID2 through a via. The gates of the transistors DP5 and DN5 are mutually connected through a gate interconnect 252, and the tops thereof are connected with the local interconnect 352. The local interconnect 352 is connected with the M1 interconnect 453 that is to be the node OUT2 through a via.

The n-type dummy transistor DN6 is placed on the left side of the transistors P3, N3, N4, and P4 constituting the inverters 26 and 27 as viewed from the figure. The transistor DN6 is constituted by four VNWs arranged in the Y direction. The top of the transistor DN6 is connected with the local interconnect 348. The local interconnect 348 is connected with the M1 interconnect 452 that is to be the middle node MID2 through a via.

Tap regions 31 and 32 are formed on both sides of the switch elements 23 and 28 in the X direction. The layout structure of the tap regions 31 and 32 is similar to the layout structure described in the first embodiment. Dummy transistors 41 and 42 are respectively formed between the tap region 31 and the region of the switch elements 23 and 28 and between the tap region 32 and the region of the switch elements 23 and 28. With this, spacing between the region of the switch elements 23 and 28 and the tap regions 31 and 32 is secured.

The layout structure of the power switch cell according to this embodiment has features as follows, for example.

The bottoms of the 15 VNWs constituting the p-type transistor PSS of the switch element 23 and the bottoms of the four VNWs constituting the p-type transistor PWS of the switch element 28 are connected in common to the bottom region 111. That is, the p-type transistor PSS and the p-type transistor PWS share the bottom region. This makes it possible to reduce the resistance value on the supply route of the power supply voltage VDD.

The p-type transistor PSS of the switch element 23 is constituted by 43 VNWs and the p-type transistor PWS of the switch element 28 is constituted by four VNWs. The tops of the total 47 VNWs are connected to the M1 interconnects 421 and 422 that are connected to the global power interconnect 11. This makes it possible to reduce the resistance value on the supply route of the power supply voltage VDD and thus prevent or reduce a power supply voltage drop. Also, the bottom regions 111 and 112 to which the bottoms of the 47 VNWs are connected extend up to portions under the local power interconnects 411 and 413, respectively, and are connected with the local power interconnects 411 and 413 in the overlap portions as viewed from top. This makes it possible to reduce the resistance value on the supply route of the power supply voltage VDD.

The dummy transistors DP1, DN1, DP2, and DN2 are placed near the left end of the cell as viewed from the figure. Also, the dummy transistors DP4, DN4, DP5, and DN5 are placed near the right end of the cell as viewed from the figure. With this placement, the transistor performance predictability can be ensured for standard cells placed on both sides of the power switch cell in the X direction. The placement of the dummy transistors is not necessarily required. However, by placing dummy transistors, the transistor pattern uniformity improves.

While the bottom region 111 has a rectangular shape to which 19 VNWs are connected in common and the bottom region 112 has a rectangular shape to which 28 VNWs are connected in common, the shape of the bottom regions to which the bottoms of VNWs are connected is not limited to this. For example, the bottom region 112 may be divided into four strips, and each column of seven VNWs arranged in the Y direction may be connected to one of the four strips.

(Alteration)

Figure 13:
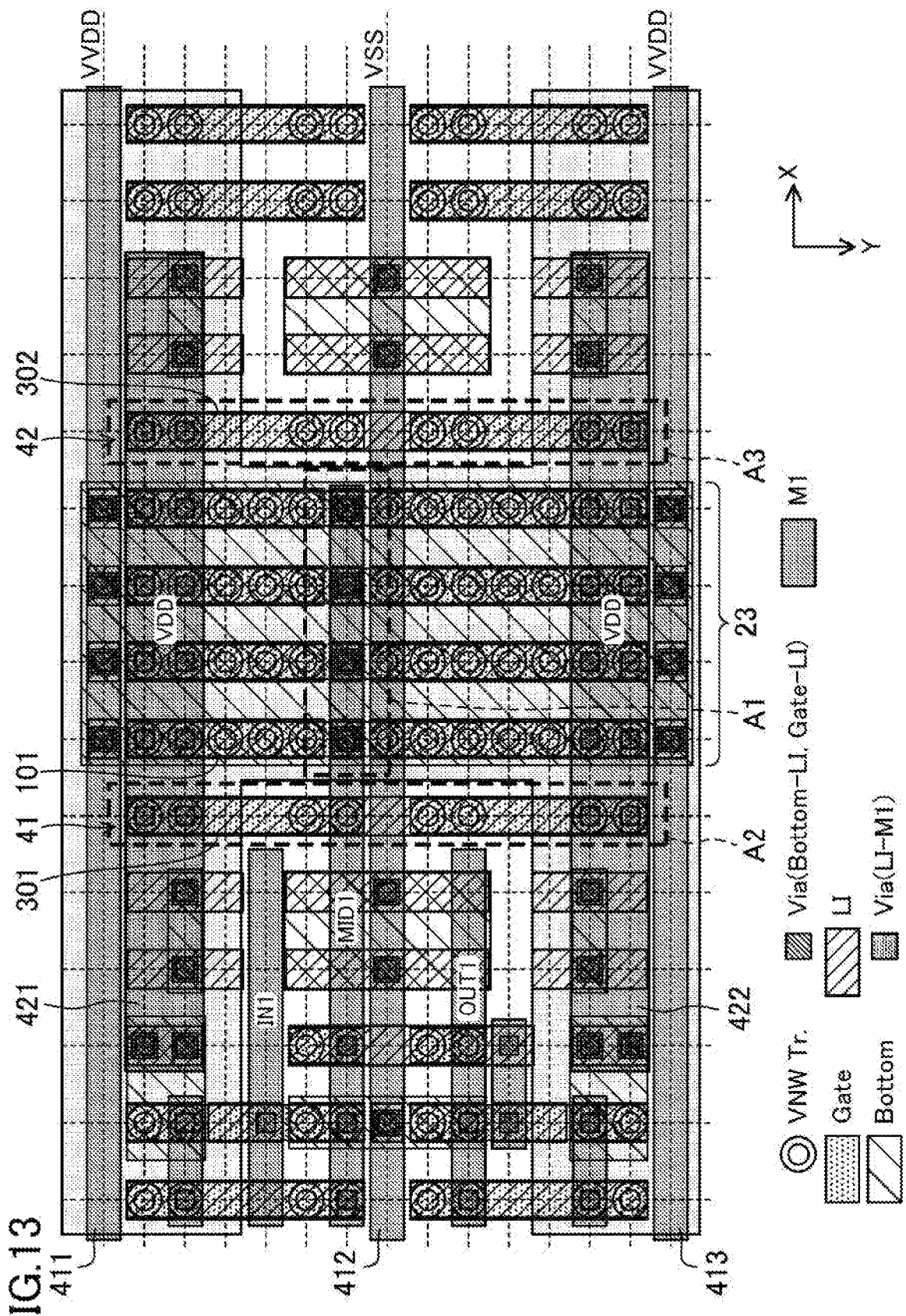
FIG. 13 is a plan view showing a layout structure of a power switch cell according to an alteration.

FIG. 13 is an overall plan view showing a layout structure of a power switch cell according an alteration. The layout structure shown in FIG. 13 is an alteration based on the layout structure of the power switch according to the first embodiment shown in FIG. 4. Note that description of a configuration common to the layout structure of FIG. 4 is omitted here.

In the layout structure of FIG. 13, a bottom region 101 is formed over the entire length of the cell in the Y direction. That is, the bottom region 101 has a configuration of the bottom regions 111 and 112 in FIG. 4 linked together under the M1 interconnect 432 (broken line A1). With this configuration, the switch element 23 constituted by the VNWs formed on the bottom region 101 entirely can supply a current directly to both the local power interconnect 411 and the local power interconnect 413. The power supply can therefore be enhanced.

In the layout structure of FIG. 13, also, in the region where the dummy transistor 41 is formed, a local interconnect 301 is connected with the M1 interconnects 421 and 422 that supply the power supply voltage VDD, through vias (broken line A2). Also, in the region where the dummy transistor 42 is formed, a local interconnect 302 is connected with the M1 interconnects 421 and 422 that supply the power supply voltage VDD, through vias (broken line A3). With this configuration, since the M1 interconnects 421 and 422 that supply the power supply voltage VDD are mutually connected inside the power switch cell, the power supply can be enhanced.

This alteration may also be applied to the layout structure of the power switch cell according to the second embodiment.

Other Embodiments

While the tap regions 31 and 32 are provided on both sides of the switch element 23 (switch elements 23, 28) in the X direction in the above embodiments, the placement is not limited to this. For example, a tap region may be provided on only one side of the switch element 23 (switch elements 23, 28), or otherwise no tap region may be provided. Note however that, since the p-substrate or the p-well is divided into two in the X direction by the presence of the switch element 23 (switch elements 23, 28) in the layout structures described above, it is preferable to provide a tap region, especially a structure for supplying the power supply voltage VSS to the p-substrate or the p-well, on each side of the switch element 23 (switch elements 23, 28).

While the M1 interconnects 421 and 422 connected to the global power interconnect 11 for supply of the power supply voltage VDD are thick interconnects having a width corresponding to two grid cells in the above embodiments, the configuration is not limited to this. For example, two interconnects each having the same width as the other M1 interconnects may be provided.

The circuit configurations of the power switch cells shown in FIGS. 3 and 8 are mere examples. A power switch cell is only required to have a switch element configured to be capable of switching between electrical connection and disconnection between the global power interconnects and the local power interconnects in accordance with a control signal. For example, in FIG. 3, buffers may be used in place of the inverters 21 and 22. In this case, the relationship between the logic of the control signal and connection/disconnection will be reversed from that described earlier. Also, while the power switch cells are double-height cells in the above embodiments, the configuration is not limited to this. For example, they may be single-height cells.

According to the present disclosure, it is possible to implement a layout structure of a power switch cell using VNW FETs that is small in area and capable of preventing or reducing a power supply voltage drop.

What is claimed is:

1. A semiconductor integrated circuit device comprising:
a global power interconnect; and
a power domain,
wherein
the power domain includes
a local power interconnect,
a plurality of standard cells connected with the local power interconnect, and
a power switch cell,
the power switch cell includes
a switch element configured to be capable of switching between electrical connection and disconnection between the global power interconnect and the local power interconnect,
the switch element is constituted by at least one vertical nanowire (VNW) FET, and
a top electrode of the VNW FET constituting the switch element is connected with the global power interconnect.

2. The semiconductor integrated circuit device of claim 1, wherein
the power switch cell includes
a bottom region that overlaps the local power interconnect as viewed from top and is connected with the local power interconnect in a portion of the bottom region overlapping the local power interconnect, and
a bottom electrode of at least any of the at least one VNW FET constituting the switch element is connected to the bottom region.

3. The semiconductor integrated circuit device of claim 1, wherein
the power switch cell includes
a second switch element lower in drive capability than the switch element, configured to be capable of switching between electrical connection and disconnection between the global power interconnect and the local power interconnect, and
the second switch element is constituted by at least one VNW FET.

4. The semiconductor integrated circuit device of claim 3, wherein
a top electrode of the VNW FET constituting the second switch element is connected with the global power interconnect.

5. The semiconductor integrated circuit device of claim 3, wherein
the power switch cell includes
a bottom region that overlaps the local power interconnect as viewed from top and is connected with the local power interconnect in a portion of the bottom region overlapping the local power interconnect, and
bottom electrodes of at least any of the at least one VNW FET constituting the switch element and the at least one VNW FET constituting the second switch element are connected to the bottom region.

6. The semiconductor integrated circuit device of claim 1, wherein
the local power interconnect extends in a first direction, and
the power switch cell includes
a dummy VNW FET placed between either one of cell ends in the first direction and the switch element.

7. A semiconductor integrated circuit device comprising:
a global power interconnect; and a power domain,
wherein
the power domain includes
a local power interconnect,
a plurality of standard cells connected with the local power interconnect, and
a power switch cell,
the local power interconnect includes
first and second power interconnects that extend in parallel in a first direction and supply a first power supply potential, and
a third power interconnect that extends in the first direction between the first and second power interconnects and supplies a second power supply potential different from the first power supply potential,
the power switch cell includes
a switch element configured to be capable of switching between electrical connection and disconnection between the global power interconnect and the first and second power interconnects, and
a bottom region overlapping the third power interconnect as viewed from top,
the switch element includes at least one first vertical nanowire (VNW) FET placed in a region between the first power interconnect and the third power interconnect and at least one second VNW FET placed in a region between the second power interconnect and the third power interconnect, and
top electrodes of the first and second VNW FETs are connected with the global power interconnect, and bottom electrodes of the first and second VNW FETs are connected with the bottom region.

8. The semiconductor integrated circuit device of claim 7, wherein
the bottom region overlaps the first and second power interconnects as viewed from top and is connected with the first and second power interconnects in portions of the bottom region overlapping the first and second power interconnects.

9. The semiconductor integrated circuit device of claim 7, wherein
the power switch cell includes
a second switch element lower in drive capability than the switch element, configured to be capable of switching between electrical connection and disconnection between the global power interconnect and the first and second power interconnects, and
the second switch element is constituted by at least one VNW FET.

10. The semiconductor integrated circuit device of claim 9, wherein
a top electrode of the VNW FET constituting the second switch element is connected with the global power interconnect.

11. The semiconductor integrated circuit device of claim 9, wherein
a bottom electrode of the VNW FET constituting the second switch element is connected to the bottom region.

12. The semiconductor integrated circuit device of claim 7, wherein
the power switch cell includes
a dummy VNW FET placed between either one of cell ends in the first direction and the switch element.

13. The semiconductor integrated circuit device of claim 7, wherein
the power switch cell includes
a fourth power interconnect connected with the global power interconnect and placed in a region between the first power interconnect and the third power interconnect, and
a fifth power interconnect connected with the global power interconnect and placed in a region between the second power interconnect and the third power interconnect.

14. The semiconductor integrated circuit device of claim 13, wherein
the power switch cell includes
an interconnect that connects the fourth power interconnect and the fifth power interconnect.

* * * * *